(12) United States Patent
Chu et al.

(10) Patent No.: US 9,941,703 B2
(45) Date of Patent: Apr. 10, 2018

(54) SOLAR POWER GENERATION SYSTEM HAVING A BACKUP INVERTER

(71) Applicant: CYBER POWER SYSTEMS, INC., Taipei (TW)

(72) Inventors: Cheng-Wei Chu, Taipei (TW); Yu-Chih Lin, Taipei (TW)

(73) Assignee: CYBER POWER SYSTEMS, INC., Taipei (TW)

( * ) Notice: Subject to any disclaimer, the term of this patent is extended or adjusted under 35 U.S.C. 154(b) by 176 days.

(21) Appl. No.: 15/176,627

(22) Filed: Jun. 8, 2016

(65) Prior Publication Data
US 2017/0005476 A1 Jan. 5, 2017

(30) Foreign Application Priority Data
Jul. 3, 2015 (TW) .............. 104121598 A

(51) Int. Cl.
*H02J 3/38* (2006.01)
*H02S 40/32* (2014.01)
*H01L 31/02* (2006.01)
*H02J 13/00* (2006.01)

(52) U.S. Cl.
CPC ........ *H02J 3/383* (2013.01); *H01L 31/02021* (2013.01); *H02J 13/001* (2013.01); *H02S 40/32* (2014.12); *Y02E 10/563* (2013.01); *Y02E 40/72* (2013.01); *Y04S 10/123* (2013.01); *Y04S 10/40* (2013.01)

(58) Field of Classification Search
None
See application file for complete search history.

(56) References Cited

U.S. PATENT DOCUMENTS

| 8,004,117 | B2 | 8/2011 | Adest et al. | |
| 8,994,218 | B2 | 3/2015 | Cheng et al. | |
| 2005/0105224 | A1* | 5/2005 | Nishi | H02M 3/285 361/18 |
| 2013/0274946 | A1* | 10/2013 | Schelenz | H02J 3/383 700/297 |

* cited by examiner

*Primary Examiner* — Jared Fureman
*Assistant Examiner* — Aqeel Bukhari
(74) *Attorney, Agent, or Firm* — Bacon & Thomas, PLLC

(57) ABSTRACT

A solar power generation system having a backup inverter, the solar power generation system has N number of solar panels, N number of inverters, at least one backup inverter and at least one AC (Alternating Current) wiring box; each inverter and the backup inverter are parallel connected to the AC wiring box; the AC wiring box can be connected to a utility grid; when each inverter is normally operated, each solar panel can supply power to each inverter; when the X-th inverter is faulted, the X-th solar panel can supply power to the backup inverter, therefore reduce the interruption time of power generation.

18 Claims, 17 Drawing Sheets

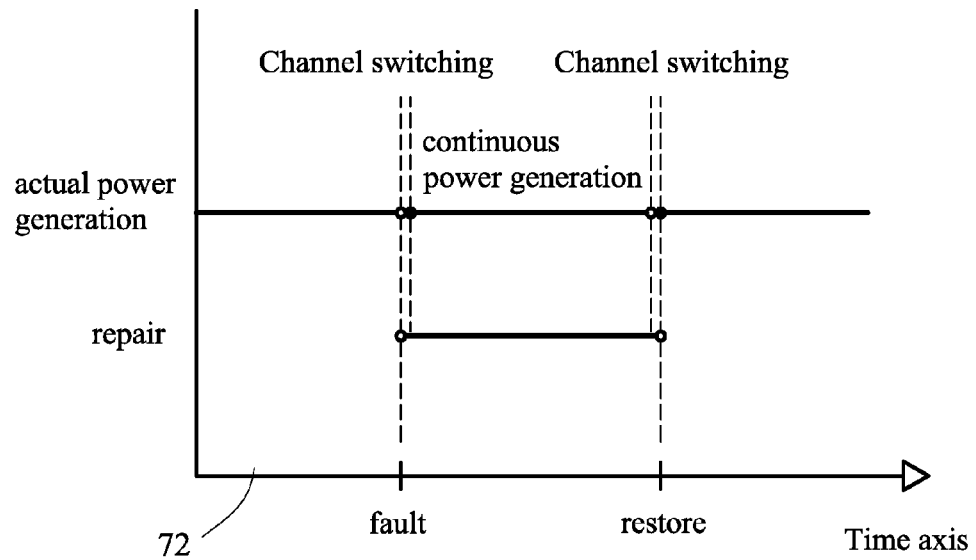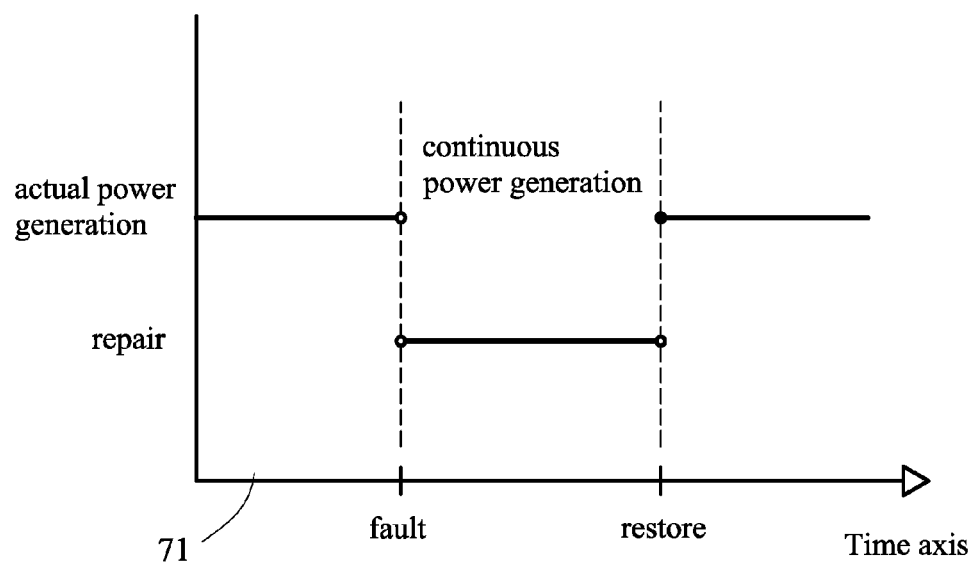
FIG. 4

56

| ✉ Cloud_Admin@CPSWW.COM 5/21 pm
Error found when get data from Inverter | Error found when get data from Inverter
CPS Admin < Cloud_Admin@CPSWW.COM> |

| 📩 Cloud_Admin@CPSWW.COM 5/20 pm
Error found when get data from Inverter | 5/20 pm02:26 |

Cloud_Admin@CPSWW.COM 5/19 pm
Error found when get data from Inverter

Cloud_Admin@CPSWW.COM 5/18 pm
Error found when get data from Inverter

Cloud_Admin@CPSWW.COM 5/17 pm
Error found when get data from Inverter

Cloud_Admin@CPSWW.COM 5/16 pm
Error found when get data from Inverter

Cloud_Admin@CPSWW.COM 5/15 pm
Error found when get data from Inverter

Cloud_Admin@CPSWW.COM 5/14 pm
Error found when get data from Inverter

Cloud_Admin@CPSWW.COM 5/13 pm
Error found when get data from Inverter

Cloud_Admin@CPSWW.COM 5/12 pm
Error found when get data from Inverter

Cloud_Admin@CPSWW.COM 5/11 pm
Error found when get data from Inverter case place : _____
inverter group : _____
name of inverter : _____
serial number of inverter : _____
serial number of cable : _____
event time : _____
classification : _____
status : _____
error code : _____
error message : _____

SOLAR POWER GENERATION SYSTEM HAVING A BACKUP INVERTER

BACKGROUND OF THE INVENTION

1. Field of the Invention

The invention relates to a solar power generation system having a backup inverter, and more particularly to enable the solar power generation system to easily start the backup inverter, the solar power generation system has N number of solar panels, N number of inverters and at least one backup inverter. When each inverter is normally operated, each of the solar panels will supply power to each of the inverters; when the X-th inverter is faulted, the X-th solar panel will supply power to the backup inverter.

2. Description of Related Art

A first prior-art is disclosed in U.S. Pat. No. 8,004,117, the first prior-art disclosed each of panels can connect an independent AC module which is alone used, each of the AC modules has an inverter. But the first prior-art is not provided with the starting function of backup inverter, when any inverter is faulted, there is a long time of power break-off. Moreover, the first prior-art is not suitable for use to a large solar power generation system, because of the transportation of large backup inverter is difficult, the large backup inverter needs many operators to transport it, that will need higher transportation cost, and that will need many maintenance staffs.

A second prior-art is disclosed in U.S. Pat. No. 8,994,218, the second prior-art disclosed an AC master redundant mini-inverter is connected to the solar panels of group 1, an off-grid redundant mini-inverter is connected to the solar panels of group 2. But the second prior-art is suitable for use to the technology field of off-grid and mini-inverter, the second prior-art is not suitable for use to the technology field of utility grid and general inverter. Thus, the second prior-art is not suitable for use to a large solar power generation system, and the second prior-art can not solve the replacement problem of large backup inverter.

SUMMARY OF THE INVENTION

It is therefore an object of the invention to provide a solar power generation system having a backup inverter, the solar power generation system comprises a plurality of control boxes, a plurality of solar panels, a plurality of inverters, at least one backup inverter, at least one AC (Alternating Current) wiring box and a data logger; each control box has a switch set, each solar panel and each inverter connect to each control box, the backup inverter is parallel connected to each of control boxes, the backup inverter and the inverters are parallel connected to the AC wiring box; the data logger communicating connects to the control boxes, the inverters and the backup inverter; when each inverter is normally operated, each switch set can be switched to a master channel, each of solar panels can supply power to each of the inverters by each DC (Direct Current) input interface and each DC master output interface; when the X-th inverter is faulted, the X-th switch set can be switched to a backup channel, the X-th solar panel can supply power to the backup inverter by the X-th DC input interface and the X-th DC backup output interface.

It is therefore another object of the invention to provide a solar power generation system having a backup inverter, the solar power generation system comprises a control box, a plurality of solar panels, a plurality of inverters, at least one backup inverter and at least one AC wiring box; the control box has a plurality of input terminals, a plurality of output terminals and at least one backup terminal; each solar panel uses an input cable to connect each input terminal, each inverter uses an output cable to connect each output terminal, the backup inverter uses an backup cable to connect the backup terminal; the backup inverter and the inverters are parallel connected to the AC wiring box; wherein each input terminal electrically connected to each output terminal, when each inverter is normally operated, each input cable and each output cable can form a master channel, each of solar panels can supply power to each of the inverters by each of output terminals; when the X-th inverter is faulted, the X-th output cable can manually change it to connect to the backup terminal, the X-th output cable and the backup cable can form a backup channel, the X-th solar panel can supply power to the backup inverter by the backup terminal.

First advantages of the invention is, the invention system can save the time of inverter replacement, and the invention system can reduce the interruption time of power generation. Thus, the actual time of power generation can be increased to improve the efficiency of power generation.

Second advantages of the invention is, the invention system can continuously generate power when any inverter is faulted, therefore the invention system can be repaired in accordance with the schedule of maintenance staffs, and the case place of the invention system can be distributed over a wide area.

Third advantages of the invention is, when any inverter of the invention system is faulted, the invention system has plenty of time to wait for repair, therefore a contractor can plan for the repair route of each workday, that will substantially reduce the transportation cost of the inverter, that will be suitable for use to a large solar power generation system, so as to solve the replacement problem of large backup inverter.

The above and other objects, features and advantages of the invention will become apparent from the following detailed description taken with the accompanying drawings.

BRIEF DESCRIPTION OF THE DRAWINGS

FIG. 4 is a power generation timeline diagram illustrating a comparison between the first embodiment of the invention with the prior-art system;

FIG. 6 is a message diagram illustrating the failure status of the invention system;

DETAILED DESCRIPTION OF THE INVENTION

Figure 1:
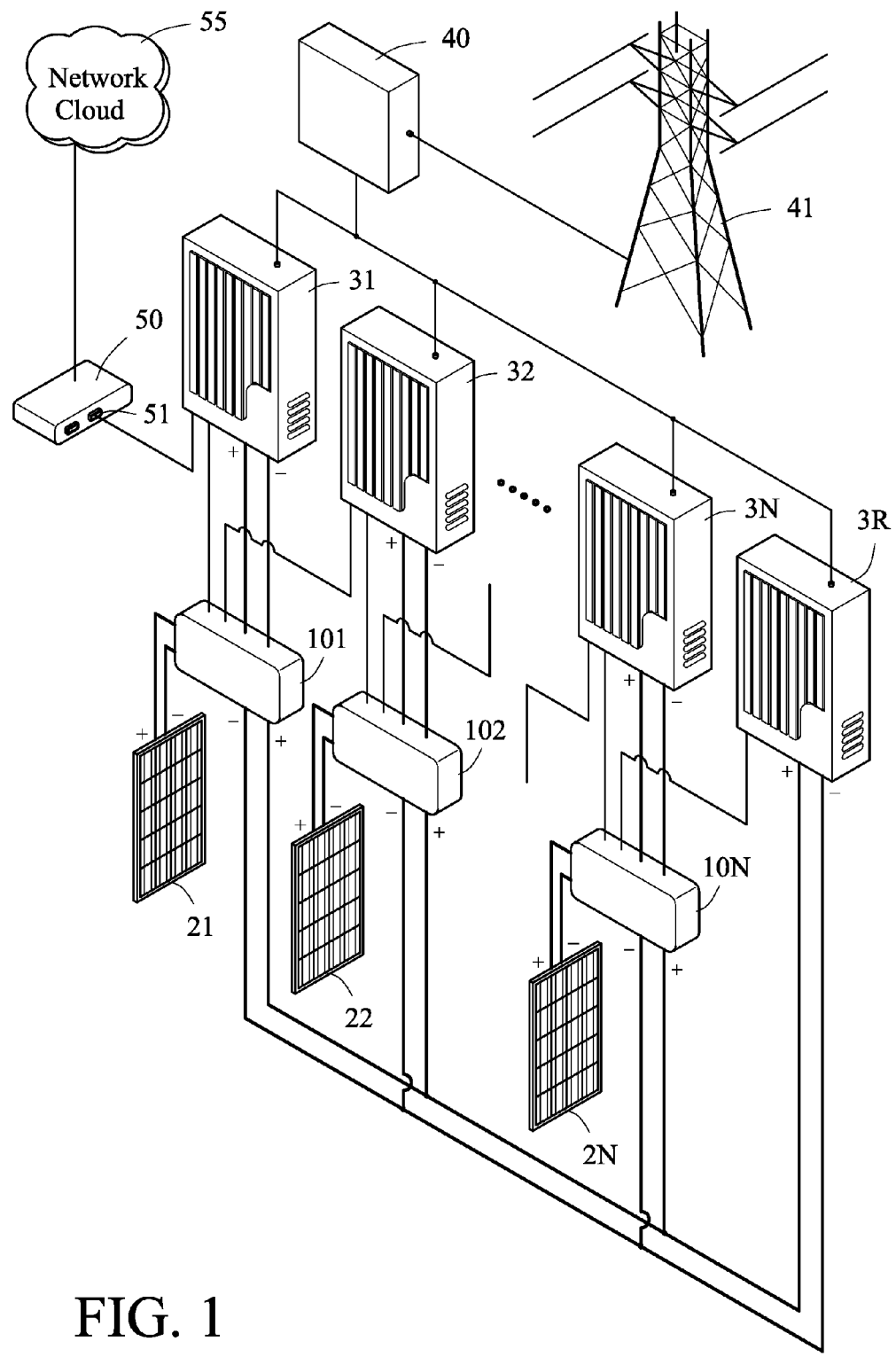
FIG. 1 is a perspective view showing a first preferred embodiment of the invention.
Figure 2:
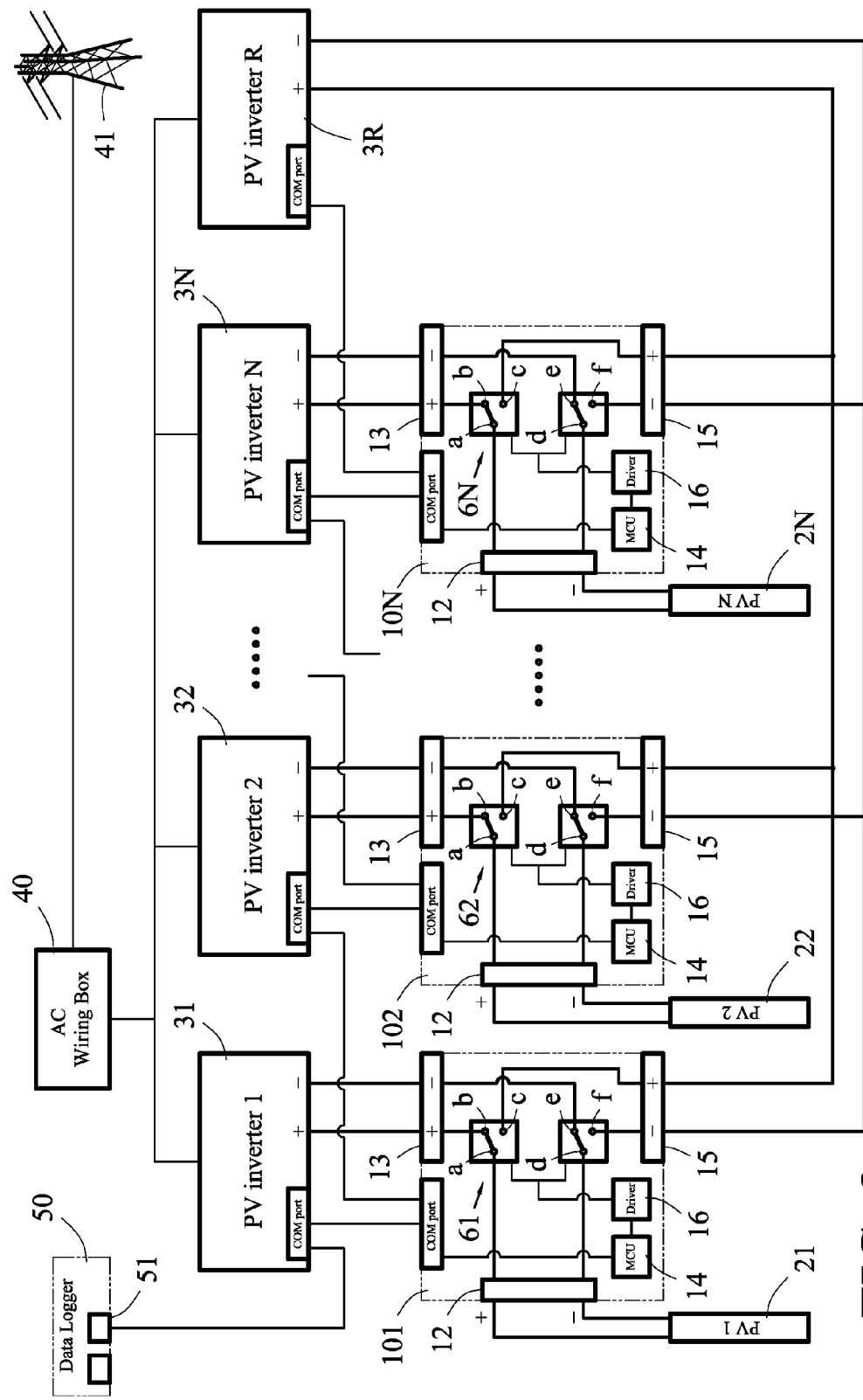
FIG. 2 is a functional block diagram illustrating the first embodiment of the invention is normally operated.
Figure 3:
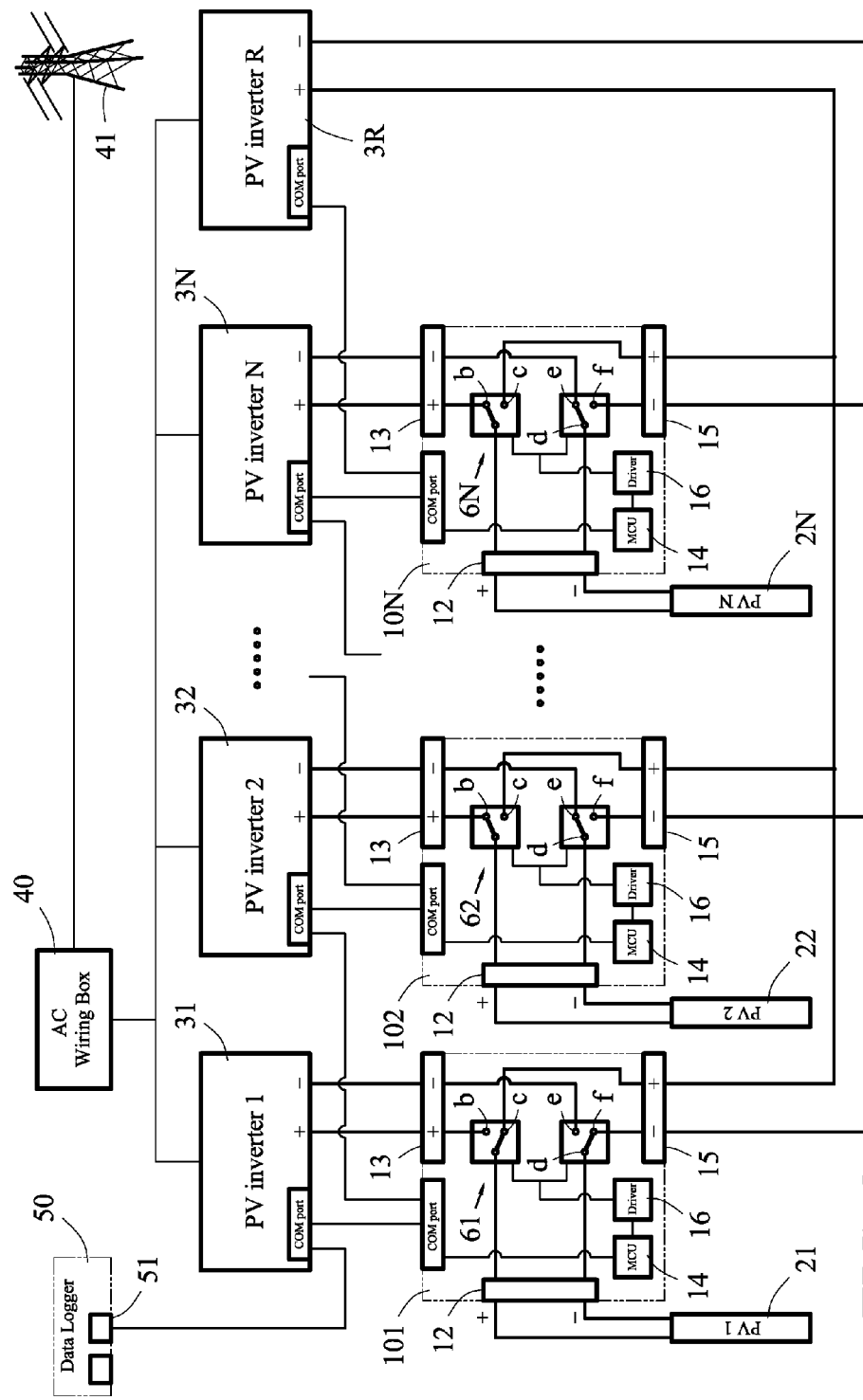
FIG. 3 is a functional block diagram illustrating the first embodiment of the invention starts a backup inverter.

Referring to FIGS. 1 to 3, a solar power generation system in accordance with a first embodiment of the invention comprises a plurality of control boxes 101-10N, a plurality of solar panels 21-2N, a plurality of inverters 31-3N, at least one backup inverter 3R, at least one AC (Alternating Current) wiring box 40, a data logger 50 and a plurality of switch sets 61-6N; the switch sets 61-6N are respectively disposed in the control boxes 101-10N, each of the solar panels 21-2N is electrically connected to each DC (Direct Current) input interface 12 of the control boxes 101-10N, each of the inverters 31-3N is electrically connected to each DC master output interface 13 of the control boxes 101-10N, the backup inverter 3R is parallel connected to each DC backup output interface 15 of the control boxes 101-10N, the backup inverter 3R and the inverters 31-3N are parallel connected to the AC wiring box 40, the AC wiring box 40 can be connected to a utility grid 41; the data logger 50 (for example but not limited to a RS485 data logger) is communicatively connected to the control boxes 101-10N, the inverters 31-3N and the backup inverter 3R; wherein each of the control boxes 101-10N has a processor 14 (e.g., Microcontroller Unit; MCU), when each of the inverters 31-3N is normally operated, each of the processors 14 can control each of the switch sets 61-6N to switch to a master channel (the initial status as shown in FIG. 2), each of the solar panels 21-2N can supply power to each of the inverters 31-3N by each of the DC input interfaces 12 and each of the DC master output interfaces 13; when the 1-th inverter 31 is faulted, the processor 14 of the 1-th control box 101 can control the 1-th switch set 61 to switch to a backup channel (the backup status as shown in FIG. 3), the 1-th solar panel 21 can supply power to the backup inverter 3R by the DC input interface 12 of the 1-th control box 101 and the DC backup output interface 15 of the 1-th control box 101, therefore reduce the interruption time of the 1-th solar panel 21 power generation. According to the above inference, when the N-th inverter 3N is faulted, the processor 14 of the N-th control box 10N can control the N-th switch set 6N to switch to a backup channel (the backup status), the N-th solar panel 2N can supply power to the backup inverter 3R by the DC input interface 12 of the N-th control box 10N and the DC backup output interface 15 of the N-th control box 10N, therefore reduce the interruption time of the N-th solar panel 2N power generation.

Examples of an executing manner of the switch sets 61-6N, each of the switch sets 61-6N has two sets of contacts; the first set of contacts has contact a, contact b and contact c; the second set of contacts has contact d, contact e and contact f; when each of the switch sets 61-6N is switched to a master channel, each of the contacts a is electrically connected to each of the contacts b, therefore each positive electrode of the solar panels 21-2N can connect to each positive electrode of the inverters 31-3N; and each of the contacts d is electrically connected to each of the contacts e, therefore each negative electrode of the solar panels 21-2N can connect to each negative electrode of the inverters 31-3N; when the 1-th switch set 61 is switched to a backup channel, the contact a of the 1-th switch set 61 is electrically connected to the contact c of the 1-th switch set 61, therefore the positive electrode of the 1-th solar panel 21 can connect to a positive electrode of the backup inverter 3R; and the contact d of the 1-th switch set 61 is electrically connected to the contact f of the 1-th switch set 61, therefore the negative electrode of the 1-th solar panel 21 can connect to a negative electrode of the backup inverter 3R (as shown in FIG. 3); wherein each of the contacts a can be connected to each positive electrode of the solar panels 21-2N by each of the DC input interfaces 12, each of the contacts b can be connected to each positive electrode of the inverters 31-3N by each of the DC master output interfaces 13, each of the contacts c can be parallel connected to the positive electrode of the backup inverter 3R by each of the DC backup output interfaces 15, each of the contacts d can be connected to each negative electrode of the solar panels 21-2N by each of the DC input interfaces 12, each of the contacts e can be connected to each negative electrode of the inverters 31-3N by each of the DC master output interfaces 13, each of the contacts f can be parallel connected to the negative electrode of the backup inverter 3R by each of the DC backup output interfaces 15; a driver 16 is disposed between each of the processors 14 and each of the switch sets 61-6N, each of the processors 14 is electrically connected to each of the drivers 16, and each of the drivers 16 is electrically connected to each of the switch sets 61-6N, therefore each of the switch sets 61-6N can be controlled.

Examples of a communicating connection manner of the data logger 50, the data logger 50 has a first communication port 51; wherein the 1-th inverter 31, the 1-th control box 101, the 2-th inverter 32, the 2-th control box 102, the N-th inverter 3N, the N-th control box 10N and the backup inverter 3R can be connected in series to the data logger 50 by the first communication port 51.

Referring to FIG. 4, a power generation timeline diagram 71 in accordance with a prior-art system, the interruption time of power generation is equal to the time of repair, and the repair of the prior-art system needs more time, therefore the prior-art system will substantially reduce the actual time of power generation. A power generation timeline diagram 72 in accordance with the invention system, the invention system can easily start a backup inverter, the interruption time of power generation is equal to the time of switching channel, the interruption time of power generation will be least, therefore the actual time of power generation can be substantially increased. Moreover, the invention system can continuously generate power when any inverter is faulted, therefore the invention system can be repaired in accordance with the schedule of maintenance staffs, and the case place of the invention system can be distributed over a wide area. Furthermore, when any inverter of the invention system is faulted, the invention system has plenty of time to wait for repair, therefore a contractor can plan for the repair route of each workday, that will reduce the transportation cost of the inverter.

Figure 5:
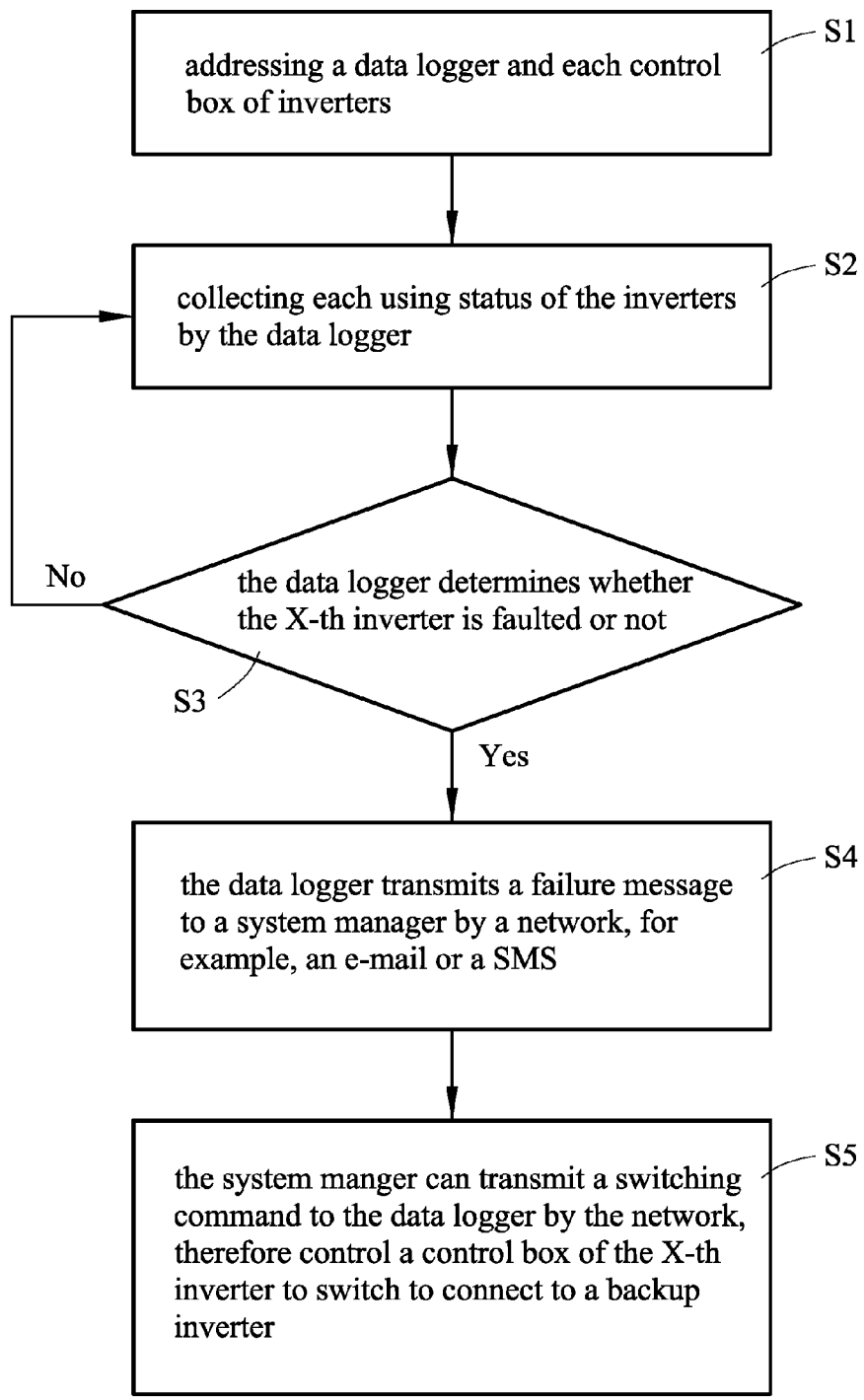
FIG. 5 is a flowchart diagram illustrating the operation manner of the invention system.

Referring to FIGS. 5 to 6 and FIG. 1, an operation process of the invention system comprises a step S1, addressing a data logger 50 and a plurality of control boxes 101-10N of inverters 31-3N, then execute next step; a step S2, collecting each using status of the inverters 31-3N by the data logger 50, then execute next step; a step S3, the data logger 50 determines whether the X-th inverter is faulted or not; if the determination is "YES", then execute next step; if the determination is "NOT", then return to the step S2; a step S4, the data logger 50 transmits a failure message to a system manager (not shown) by a network 55, for example, an e-mail (electronic mail) 56 or a SMS (short message service); wherein contents of failure message 57 can select from a case place, an inverter group, a name of inverter, a serial number of inverter, a serial number of cable, an event time, a classification, a status, an error code or an error message. Moreover, the operation process of the invention system further comprises a step S5, the system manger can transmit a switching command to the data logger 50 by the network 55, therefore control a control box of the X-th inverter to switch to connect to a backup inverter 3R.

Figure 7:
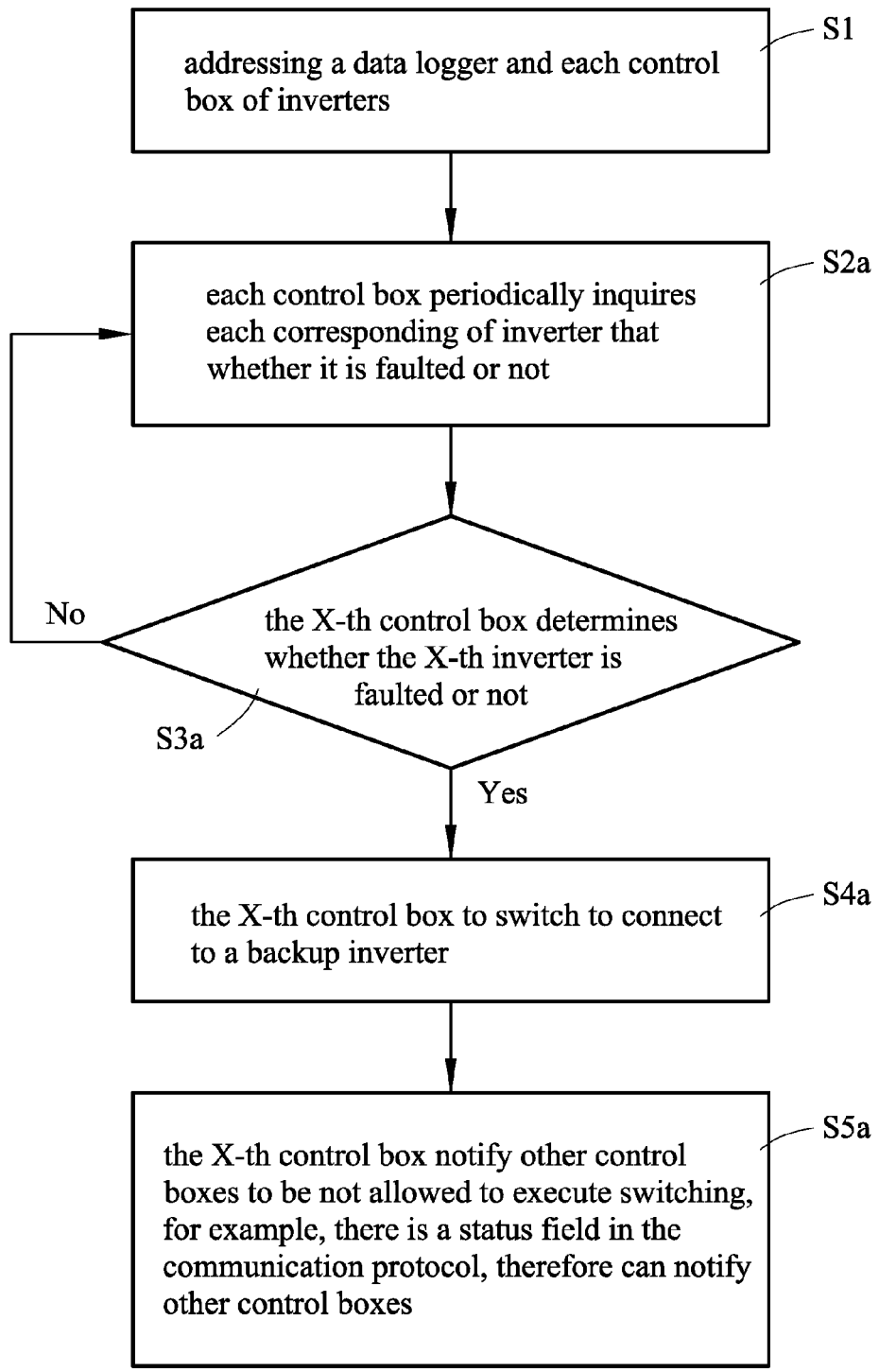
FIG. 7 is another flowchart diagram illustrating the operation of the invention system.

Referring to FIG. 7 and FIG. 1, an operation process of the invention system comprises a step S1, addressing a data logger 50 and a plurality of control boxes 101-10N of inverters 31-3N, then execute next step; a step S2a, each of the control boxes 101-10N periodically inquires each corresponding of the inverters 31-3N that whether it is faulted or not; a step S3a, the X-th control box determines whether the X-th inverter is faulted or not; if the determination is "YES", then execute next step; if the determination is "NOT", then return to the step S2a; a step S4a, the X-th control box to switch to connect to a backup inverter 3R. Moreover, the operation process of the invention system further comprises a step S5a, the X-th control box notify other control boxes to be not allowed to execute switching, for example, there is a status field in the communication protocol (show master channel/backup channel), therefore can notify other control boxes.

Figure 8:
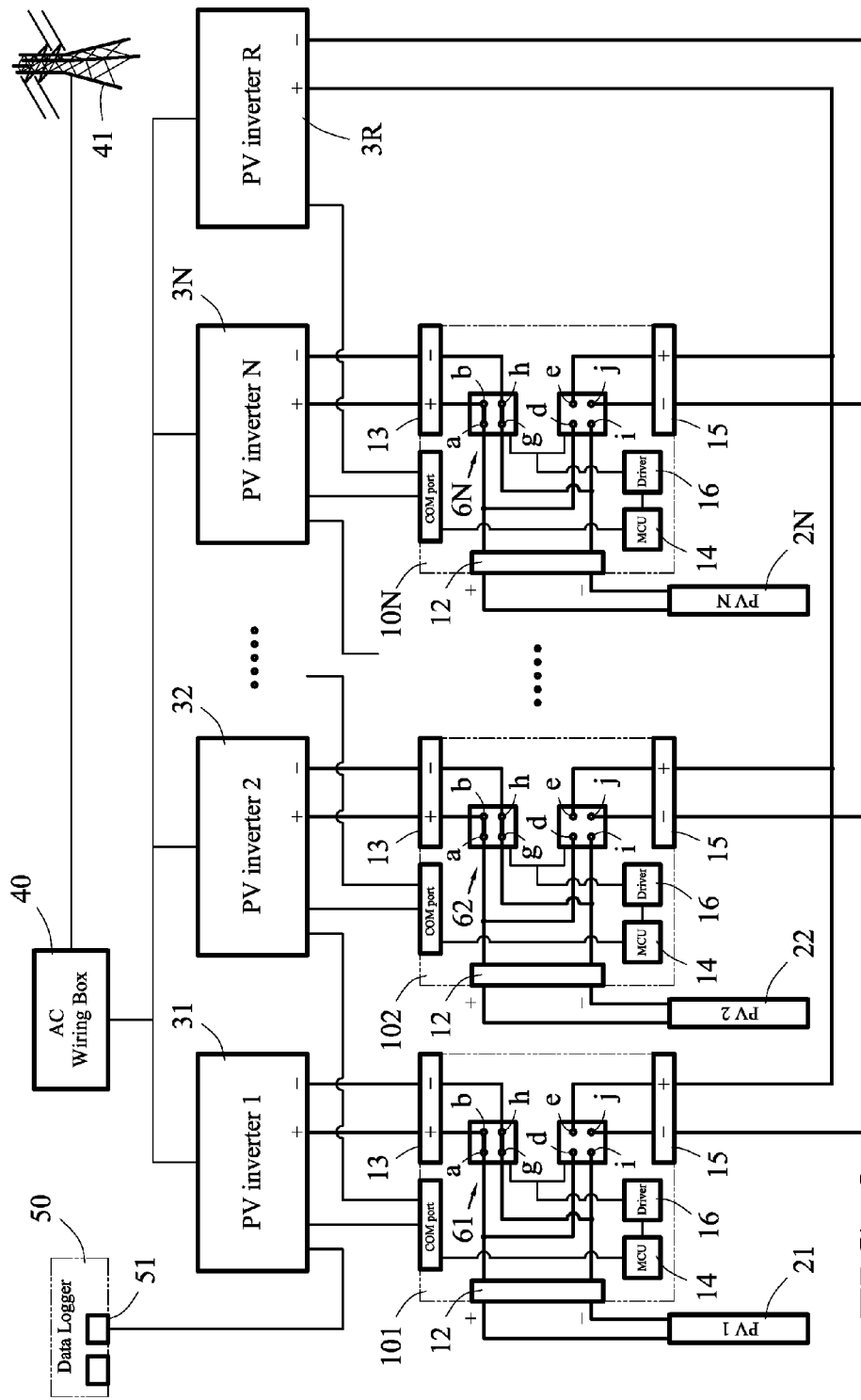
FIG. 8 is a functional block diagram illustrating a second embodiment of the invention is normally operated.
Figure 9:
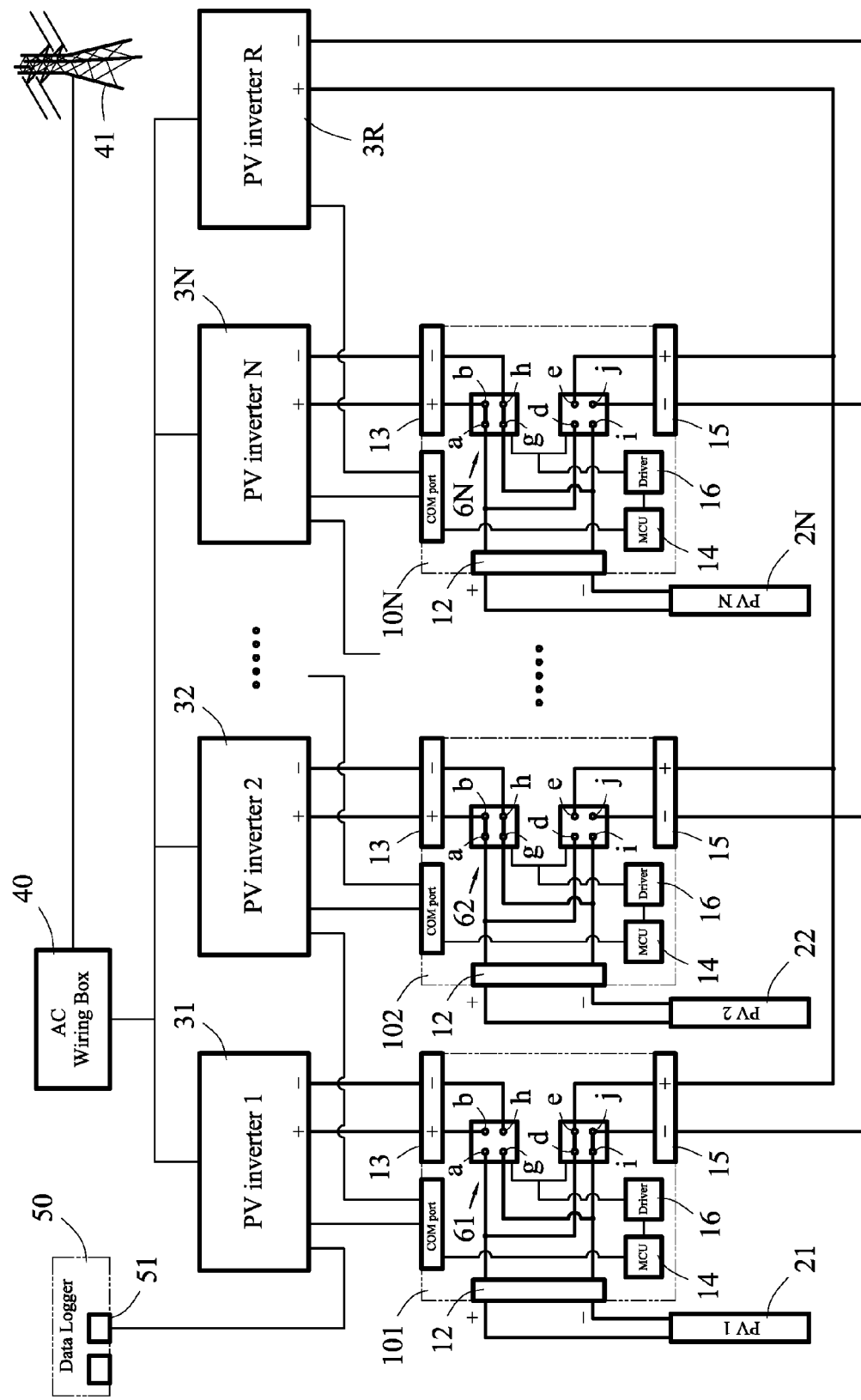
FIG. 9 is a functional block diagram illustrating the second embodiment of the invention starts a backup inverter.

Referring to FIGS. 8 to 9 and FIG. 1, a second embodiment of the invention system is almost same as the first embodiment of the invention, the difference between them is, each of the switch sets 61-6N has two sets of contacts; the first set of contacts has contact a, contact b, contact g and contact h; the second set of contacts has contact d, contact e, contact i and contact j. When each of the inverters 31-3N is normally operated, each of the processors 14 of the control boxes 101-10N can control each of the switch sets 61-6N to switch to a master channel (the initial status as shown in FIG. 8), each of the contacts a is electrically connected to each of the contacts b, therefore each positive electrode of the solar panels 21-2N can connect to each positive electrode of the inverters 31-3N; and each of the contacts g is electrically connected to each of the contacts h, therefore each negative electrode of the solar panels 21-2N can connect to each negative electrode of the inverters 31-3N; each of the solar panels 21-2N can supply power to each of the inverters 31-3N by each of the DC input interfaces 12 and each of the DC master output interfaces 13. When the 1-th inverter 31 is faulted, the processor 14 of the 1-th control box 101 can control the 1-th switch set 61 to switch to a backup channel (the backup status as shown in FIG. 9), the contacts d of the 1-th switch set 61 is electrically connected to the contacts e of the 1-th switch set 61, therefore the positive electrode of the 1-th solar panel 21 can connect to a positive electrode of the backup inverter 3R; and the contacts i of the 1-th switch set 61 is electrically connected to the contacts j of the 1-th switch set 61, therefore the negative electrode of the 1-th solar panel 21 can connect to a negative electrode of the backup inverter 3R, the 1-th solar panel 21 can supply power to the backup inverter 3R by the 1-th DC input interface 12 and the 1-th DC backup output interface 15.

Examples of an executing manner of the switch sets 61-6N for the second embodiment of the invention, each of the contacts a is parallel connected to each of the contacts d, each of the contacts a and each of the contacts d can be connected to each positive electrode of the solar panels 21-2N by each of the DC input interfaces 12, each of the contacts b can be connected to each positive electrode of the inverters 31-3N by each of the DC master output interfaces 13, each of the contacts e is parallel connected to the positive electrode of the backup inverter 3R by each of the DC backup output interfaces 15; each of the contacts g is parallel connected to each of the contacts i, each of the contacts g and each of the contacts i can be connected to each negative electrode of the solar panels 21-2N by each of the DC input interfaces 12, each of the contacts h can be connected to each negative electrode of the inverters 31-3N by each of the DC master output interfaces 13, each of the contacts j is parallel connected to the negative electrode of the backup inverter 3R by each of the DC backup output interfaces 15; a driver 16 is disposed between each of the processors 14 and each of the switch sets 61-6N, each of the processors 14 is electrically connected to each of the drivers 16, and each of the drivers 16 is electrically connected to each of the switch sets 61-6N, therefore each of the switch sets 61-6N can be controlled.

Figure 10:
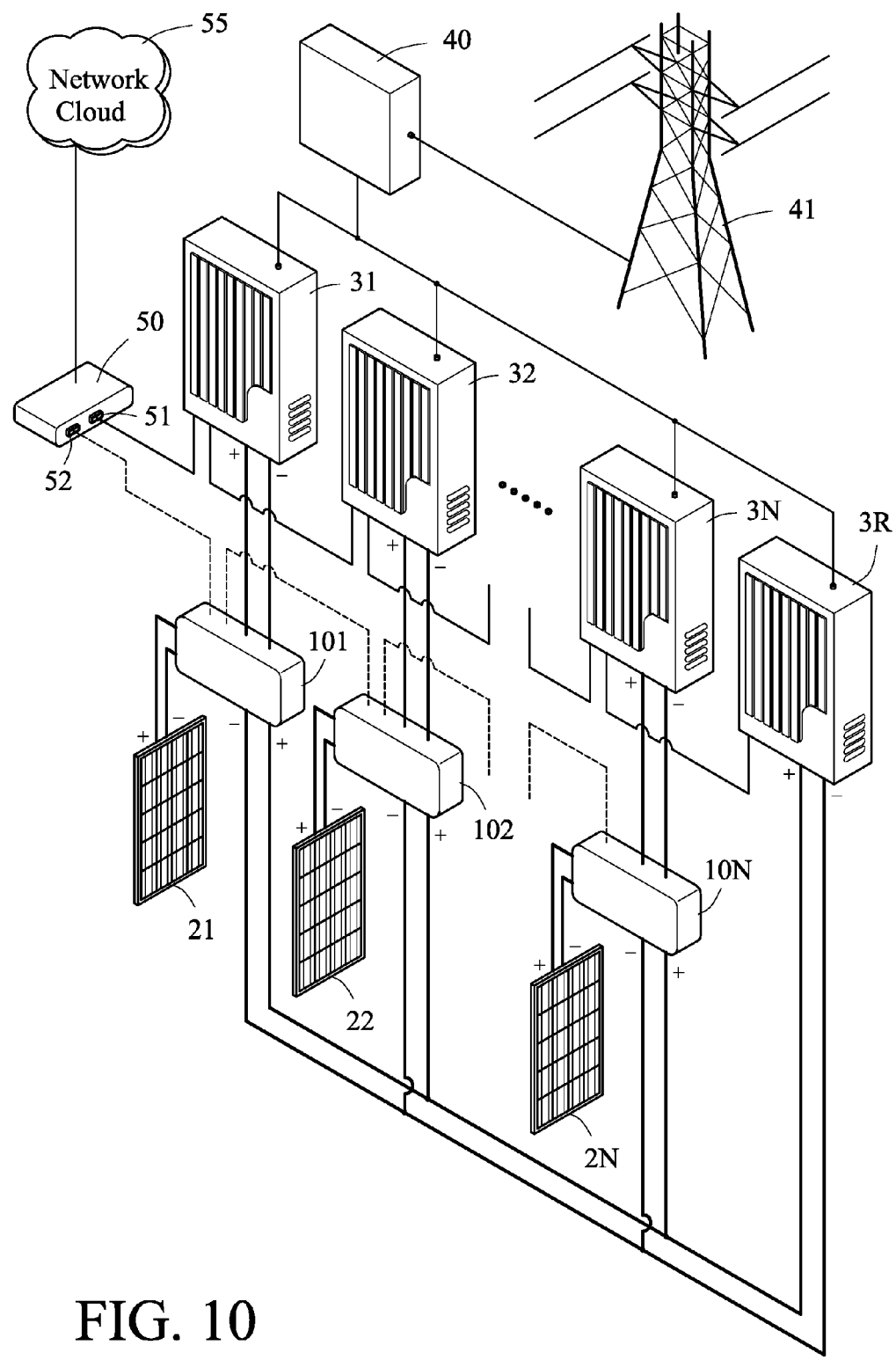
FIG. 10 is a perspective view showing a third embodiment of the invention.
Figure 11:
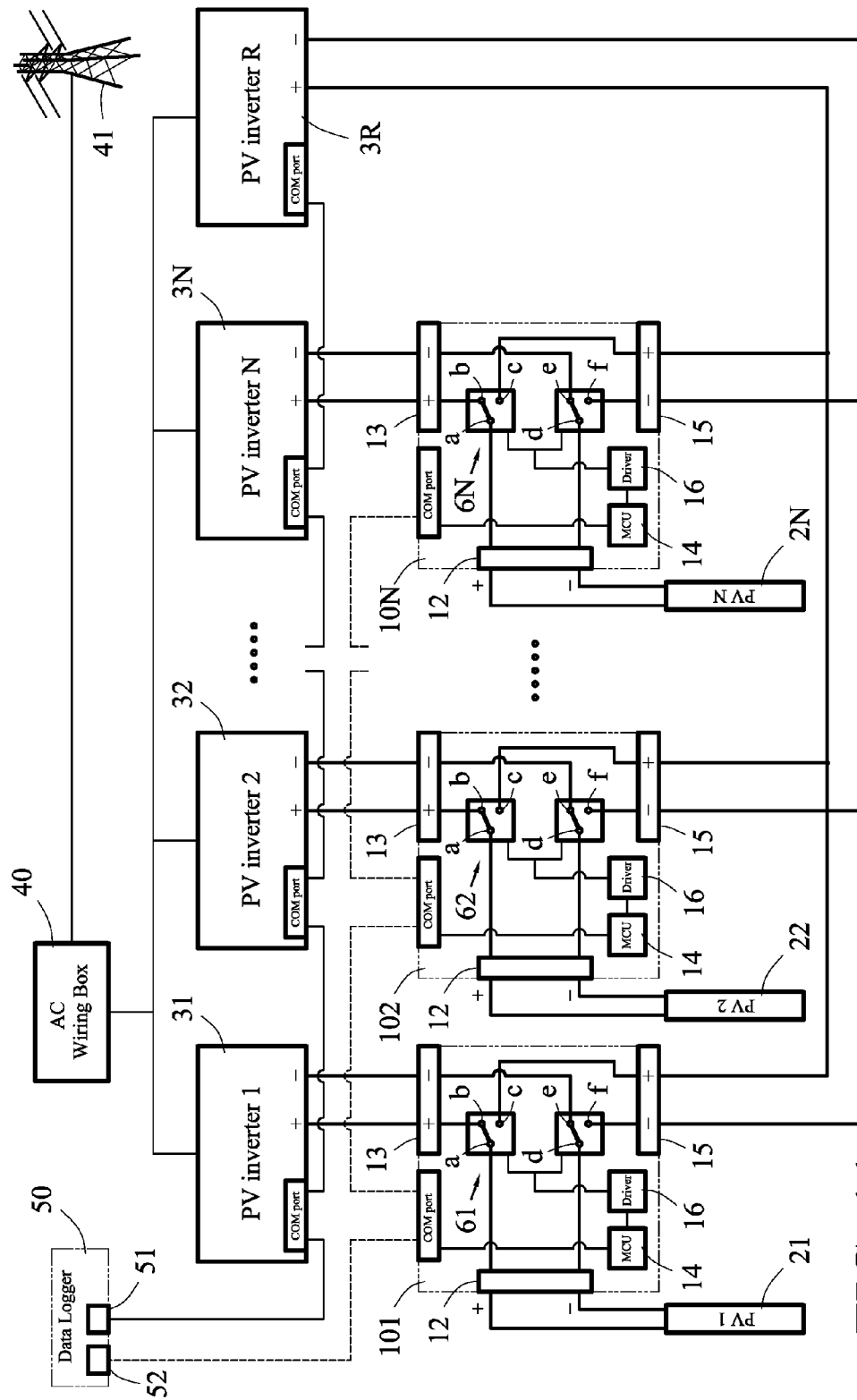
FIG. 11 is a functional block diagram illustrating the third embodiment of the invention is normally operated.
Figure 12:
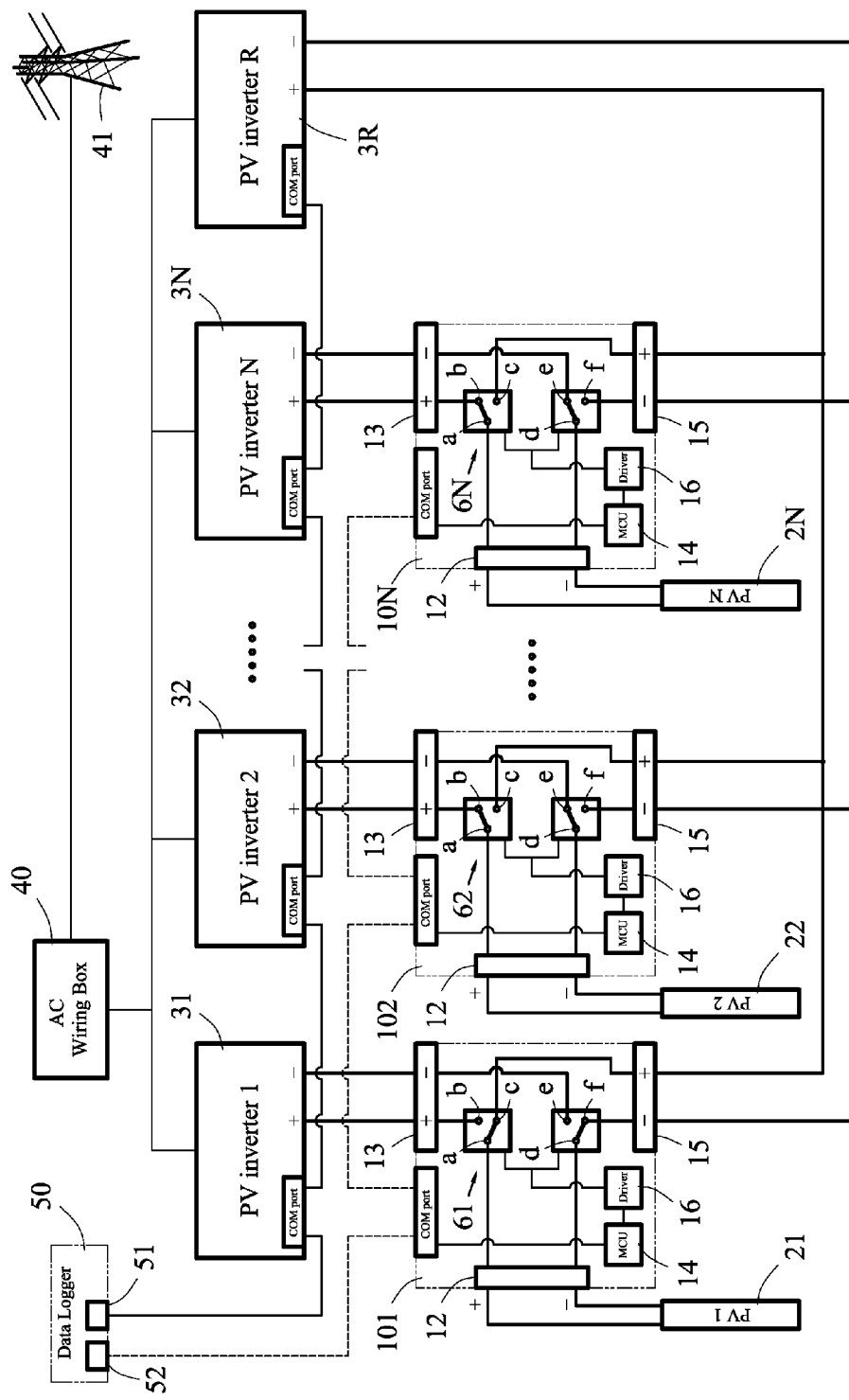
FIG. 12 is a functional block diagram illustrating the third embodiment of the invention starts a backup inverter.

Referring to FIGS. 10 to 12, a third embodiment of the invention system is almost same as the first embodiment of the invention, the difference between them is, the inverters 31-3N and the backup inverter 3R can be connected in series to a first communication port 51 of the data logger 50, and the control boxes 101-10N can be connected in series to a second communication port 52 of the data logger 50; when each of the inverters 31-3N is normally operated, each of the processors 14 can control each of the switch sets 61-6N to switch to a master channel (the initial status as shown in FIG. 11); when the 1-th inverter 31 is faulted, the processor 14 of the 1-th control box 101 can control the 1-th switch set 61 to switch to a backup channel (the backup status as shown in FIG. 12), and so on; wherein the executing manner of the switch sets 61-6N, please refer to the first embodiment description of the invention.

Figure 13:
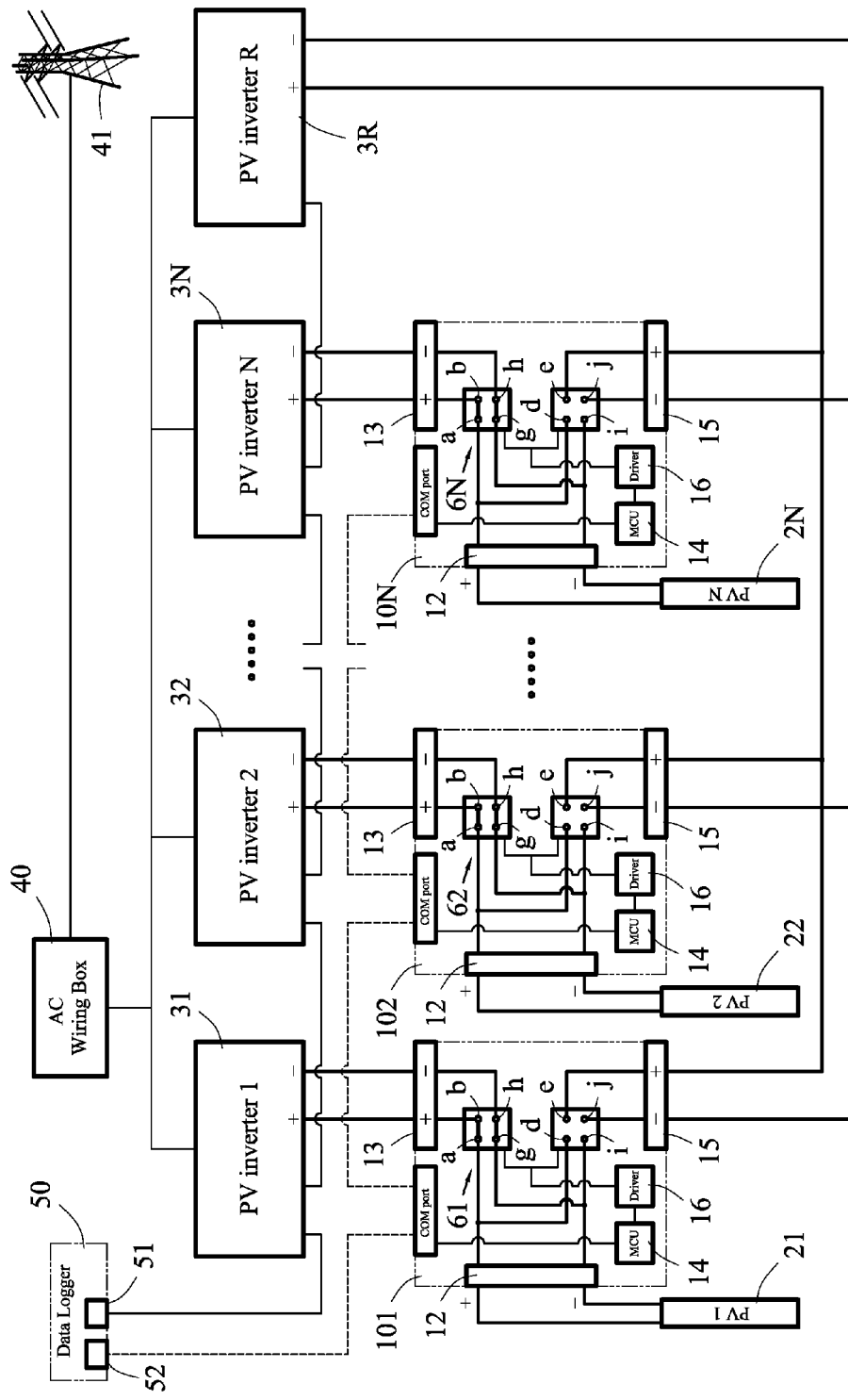
FIG. 13 is a functional block diagram illustrating a fourth embodiment of the invention is normally operated.
Figure 14:
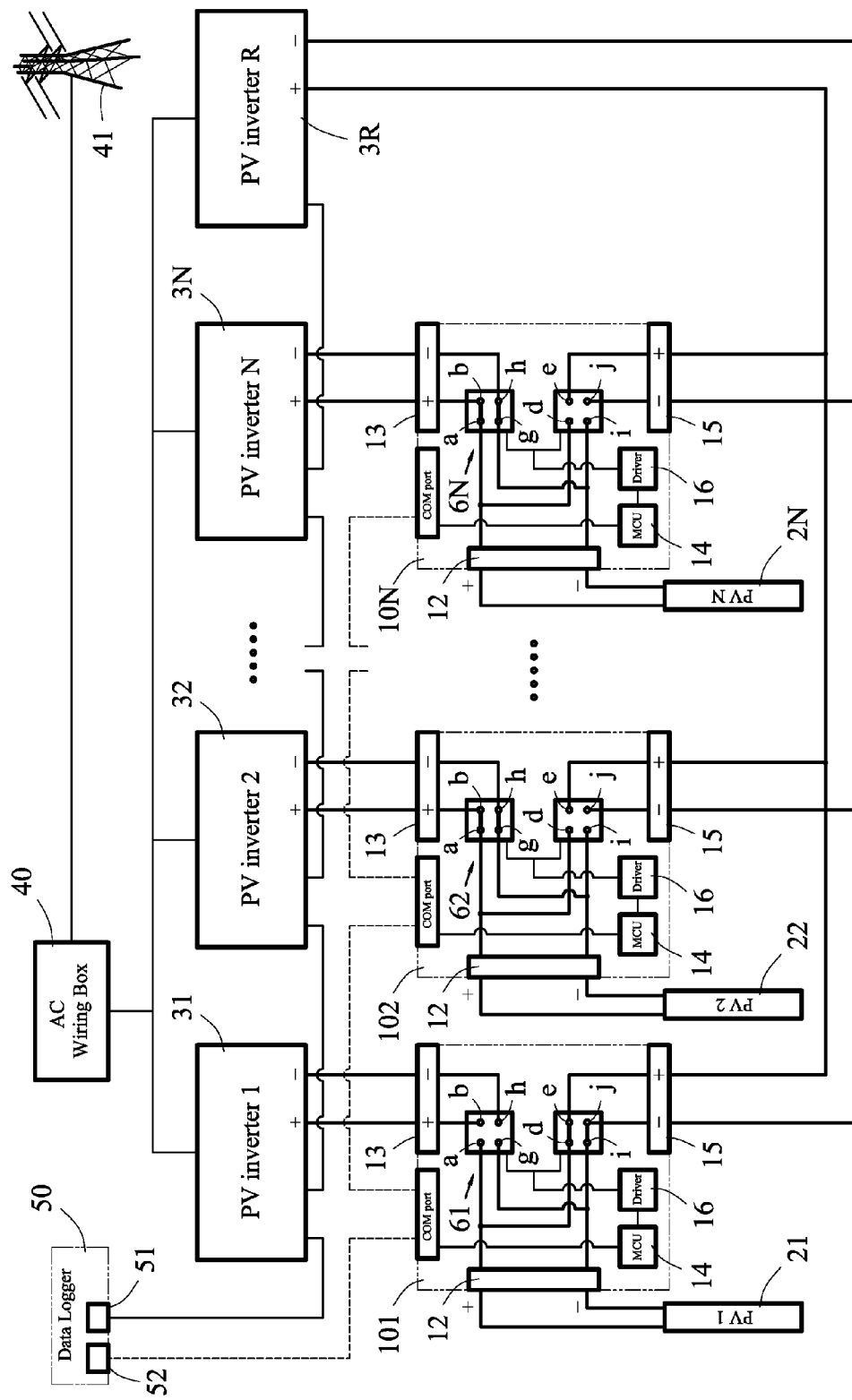
FIG. 14 is a functional block diagram illustrating the fourth embodiment of the invention starts a backup inverter.

Referring to FIGS. 13 to 14 and FIG. 10, a fourth embodiment of the invention system is almost same as the second embodiment of the invention, the difference between them is, the inverters 31-3N and the backup inverter 3R can be connected in series to a first communication port 51 of the data logger 50, and the control boxes 101-10N can be connected in series to a second communication port 52 of the data logger 50; when each of the inverters 31-3N is normally operated, each of the processors 14 can control each of the switch sets 61-6N to switch to a master channel (the initial status as shown in FIG. 13); when the 1-th inverter 31 is faulted, the processor 14 of the 1-th control box 101 can control the 1-th switch set 61 to switch to a backup channel (the backup status as shown in FIG. 14), and so on; wherein the executing manner of the switch sets 61-6N, please refer to the second embodiment description of the invention.

Figure 15:
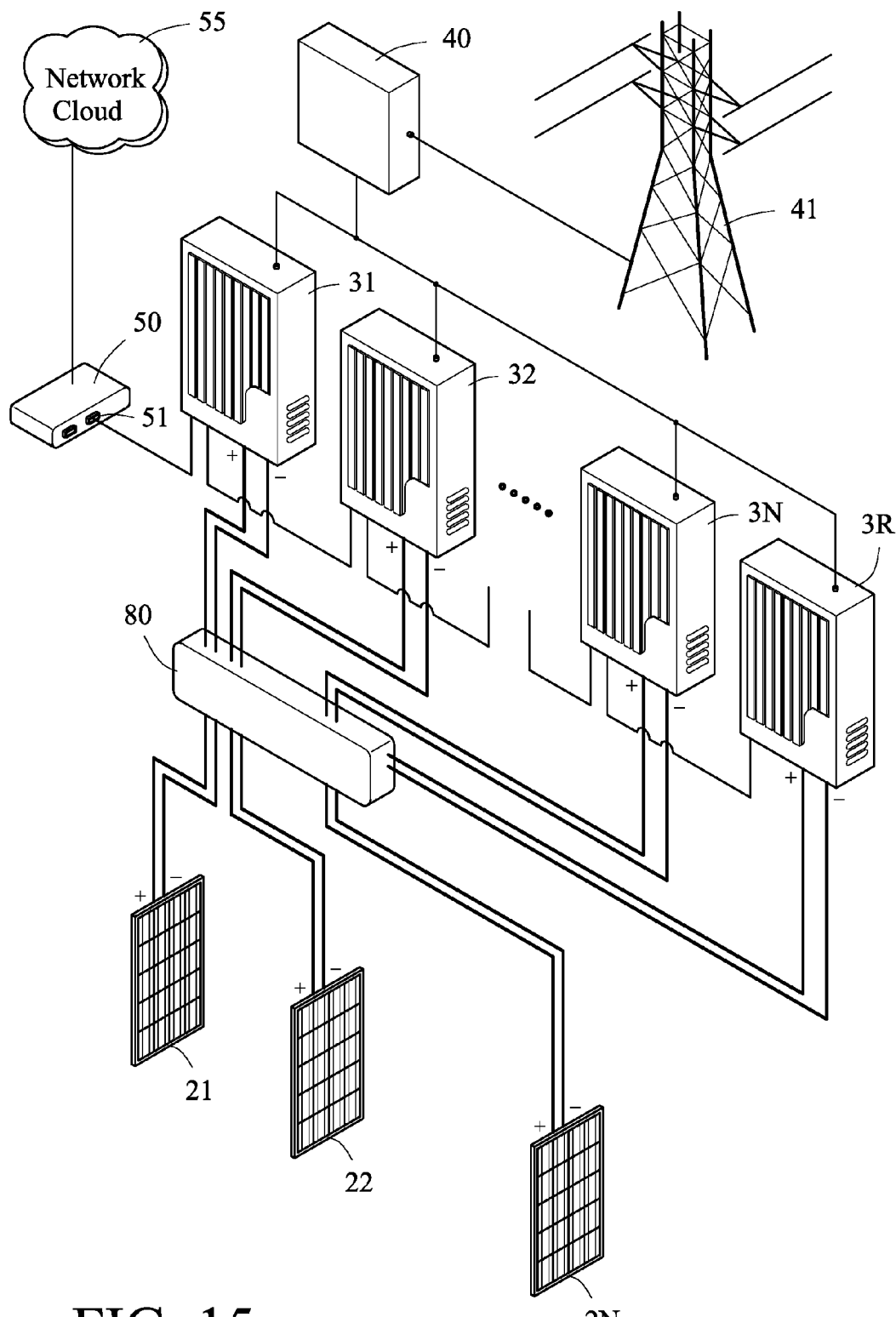
FIG. 15 is a perspective view showing a fifth embodiment of the invention.
Figure 16:
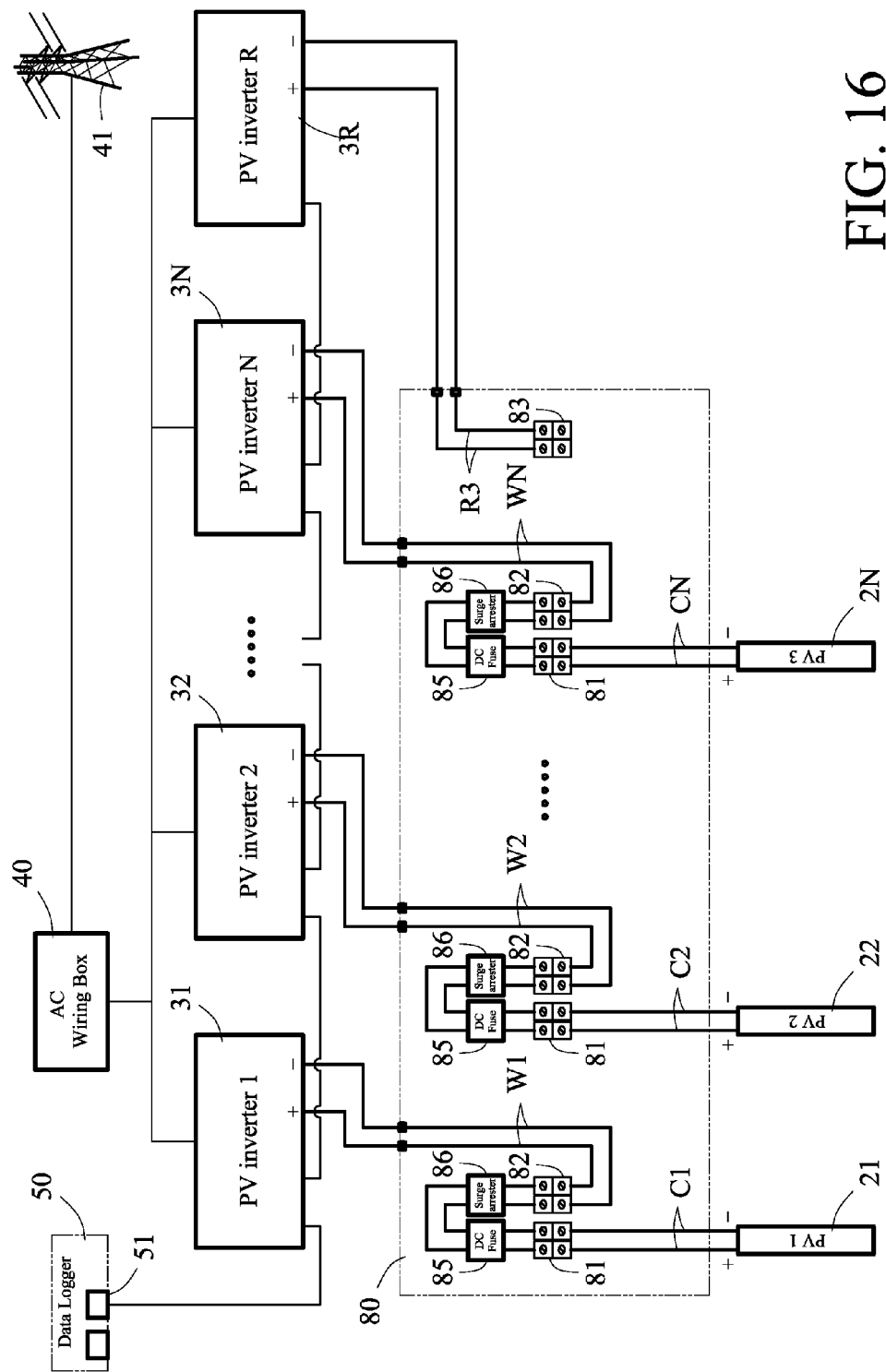
FIG. 16 is a functional block diagram illustrating the fifth embodiment of the invention is normally operated.
Figure 17:
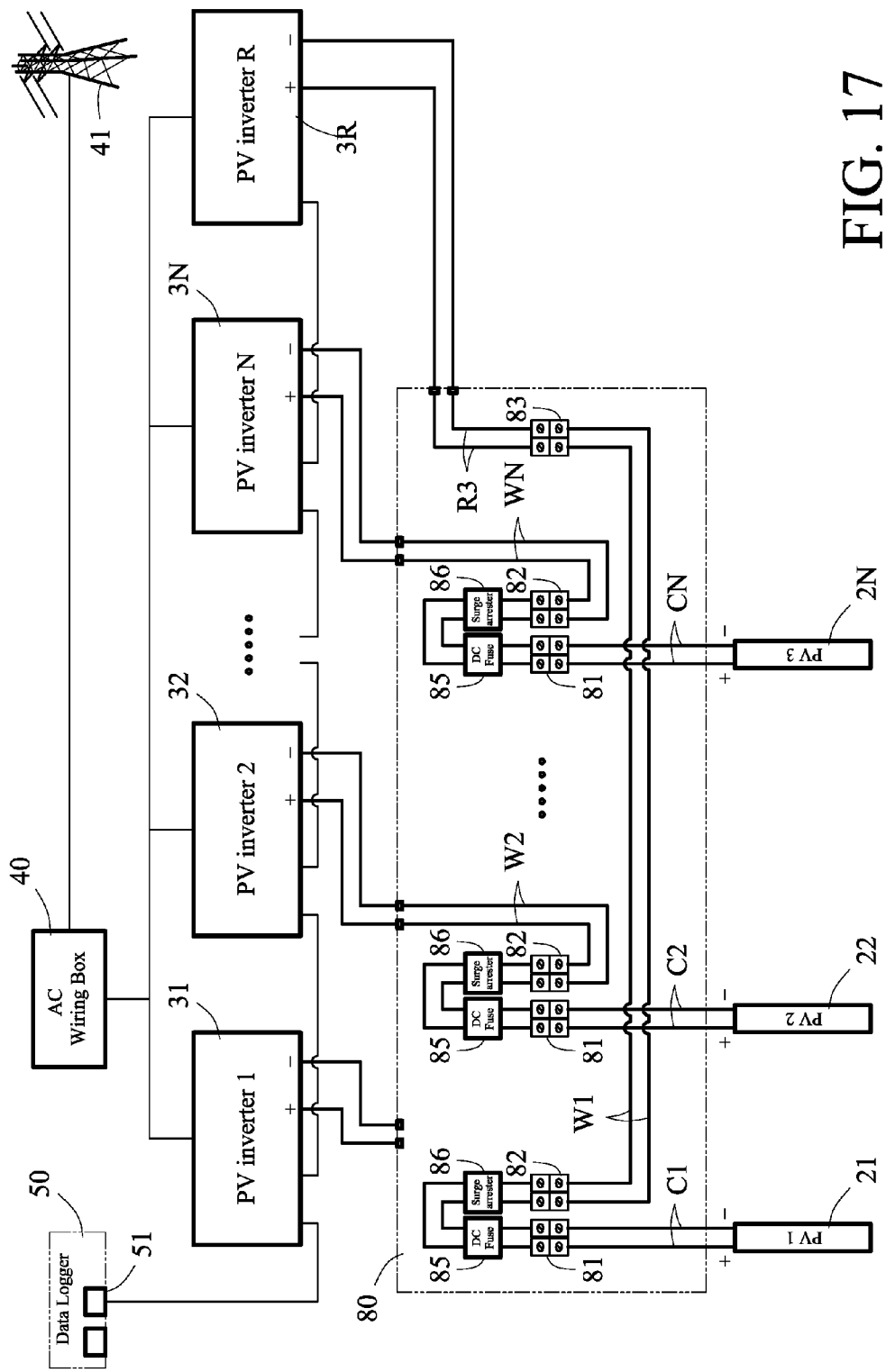
FIG. 17 is a functional block diagram illustrating the fifth embodiment of the invention starts a backup inverter.

Referring to FIGS. 15 to 17, a solar power generation system in accordance with a fifth embodiment of the invention comprises a control box 80, a plurality of solar panels 21-2N, a plurality of inverters 31-3N, at least one backup inverter 3R and at least one AC wiring box 40; the control box 80 has a plurality of input terminals 81, a plurality of output terminals 82 and at least one backup terminal 83; the solar panels 21-2N are individually connected to the input terminals 81 by a plurality of input cables C1-CN, the inverters 31-3N are individually connected to the output terminals 82 by a plurality of output cables W1-WN, the backup inverter 3R is connected to the backup terminal 83 by a backup cable R3; the backup inverter 3R and the inverters 31-3N are parallel connected to the AC wiring box 40, the AC wiring box 40 can be connected to a utility grid 41; wherein each of the input terminals 81 is electrically connected to each of the output terminals 82, when each of the inverters 31-3N is normally operated, each of the input cables C1-CN and the output cables W1-WN can form a master channel (the initial status as shown in FIG. 16), each of the solar panels 21-2N can supply power to each of the inverters 31-3N by each of the output terminals 82; when the 1-th inverter 31 is faulted, the 1-th output cable W1 can manually change it to connect to the backup terminal 83 (for example, the 1-th output cable W1 can be manually changed it to connect to the backup terminal 83 by the inspecting staff of case place), the 1-th output cable W1 and the backup cable R3 can form a backup channel (the backup status as shown in FIG. 17), the 1-th solar panel 21 can supply power to the backup inverter 3R by the backup terminal 83, and so on.

Examples of an executing manner of each input terminals 81 and each output terminals 82 for the fifth embodiment of the invention, a DC fuse 85 and a surge arrester 86 can be disposed between each input terminal 81 and each output terminal 82.

Examples of a management manner of the inverters 31-3N for the fifth embodiment of the invention, the invention system further comprises a data logger 50; the inverters 31-3N and the backup inverter 3R can be connected in series to a first communication port 51 of the data logger 50; the data logger 50 can collect the using status of the inverters 31-3N; when the data logger 50 determines that the X-th inverter is faulted, the data logger 50 will transmit a failure message to a system manager (not shown) by a network 55, the failure message can select from an e-mail 56 or a SMS (please refer to the illustrating of FIG. 6); wherein contents of failure message 57 can select from a case place, an inverter group, a name of inverter, a serial number of inverter, a serial number of cable, an event time, a classification, a status, an error code or an error message.

What is claimed is:

1. A solar power generation system having a backup inverter, the solar power generation system comprising:
   a plurality of control boxes (101-10N), each control box has a switch set;
   a plurality of solar panels (21-2N), each solar panel electrically connected to a DC (Direct Current) input interface of each control box;
   a plurality of inverters (31-3N), each inverter electrically connected to a DC master output interface of each control box;
   at least one backup inverter (3R), the backup inverter (3R) parallel connected to a DC backup output interface of each control box;
   at least one AC (Alternating Current) wiring box (40), the backup inverter (3R) and the inverters (31-3N) parallel connected to the AC wiring box (40);
   a data logger (50), the data logger (50) communicatively connected to the control boxes (101-10N), the inverters (31-3N) and the backup inverter (3R);
   wherein each control box has a processor, when each inverter is normally operated, each processor can control each switch set to switch to a master channel, each solar panel can supply power to each inverter by each DC input interface and each DC master output interface; when the X-th inverter is faulted, the processor of the X-th control box can control the X-th switch set to switch to a backup channel, the X-th solar panel can supply power to the backup inverter (3R) by the DC input interface of the X-th control box and the DC backup output interface of the X-th control box, therefore reduce the interruption time of the X-th solar panel power generation.

2. The solar power generation system having a backup inverter of claim 1, wherein each switch set has contact (a), contact (b), contact (c), contact (d), contact (e) and contact (f); when each switch set is switched to the master channel, each contact (a) is electrically connected to each contact (b), therefore each positive electrode of the solar panels (21-2N) can connect to each positive electrode of the inverters (31-3N); and each contact (d) is electrically connected to each contact (e), therefore each negative electrode of the solar panels (21-2N) can connect to each negative electrode of the inverters (31-3N); when the X-th switch set is switched to a backup channel, the X-th contact (a) is electrically connected to the X-th contact (c), therefore the positive electrode of the X-th solar panel can connect to a positive electrode of the backup inverter (3R); and the X-th contact (d) is electrically connected to the X-th contact (f), therefore the negative electrode of the X-th solar panel can connect to a negative electrode of the backup inverter (3R).

3. The solar power generation system having a backup inverter of claim 2, wherein each of the contacts (a) can be connected to each positive electrode of the solar panels (21-2N) by each of the DC input interfaces, each of the contacts (b) can be connected to each positive electrode of the inverters (31-3N) by each of the DC master output interfaces, each of the contacts (c) can be parallel connected to the positive electrode of the backup inverter (3R) by each of the DC backup output interfaces, each of the contacts (d) can be connected to each negative electrode of the solar panels (21-2N) by each of the DC input interfaces, each of the contacts (e) can be connected to each negative electrode of the inverters (31-3N) by each of the DC master output interfaces, each of the contacts (f) can be parallel connected to the negative electrode of the backup inverter (3R) by each of the DC backup output interfaces; a driver is disposed between each processor and each switch set, each processor is electrically connected to each driver, and each driver is electrically connected to each switch set, therefore each switch set can be controlled.

4. The solar power generation system having a backup inverter of claim 1, wherein a communicating connection manner of the data logger (50) comprises a first communication port of the data logger (50) can serially connect the 1-th inverter, the 1-th control box, the 2-th inverter, the 2-th control box, the N-th inverter, the N-th control box and the backup inverter (3R).

5. The solar power generation system having a backup inverter of claim 1, wherein the data logger (50) can collect the using status of each inverter; when the data logger (50) determines that the X-th inverter is faulted, the data logger (50) will transmit a failure message to a system manager by a network, the failure message can select from an e-mail (electronic mail) or a SMS (short message service); wherein contents of the failure message can select from a case place, an inverter group, a name of inverter, a serial number of inverter, a serial number of cable, an event time, a classification, a status, an error code or an error message.

6. The solar power generation system having a backup inverter of claim 5, wherein the system manger can transmit a switching command to the data logger (50) by the network, therefore control the X-th control box of the X-th inverter to switch to connect to the backup inverter (3R).

7. The solar power generation system having a backup inverter of claim 1, wherein each control box can periodically inquires each corresponding inverter that whether it is faulted or not; when the X-th control box determined that the X-th inverter is faulted, the X-th control box can switch to connect to the backup inverter (3R).

8. The solar power generation system having a backup inverter of claim 7, wherein each control box has a status field in the communication protocol; when the X-th control box switched to connect to the backup inverter (3R), the X-th control box can notify other control boxes to be not allowed to execute switching.

9. A solar power generation system having a backup inverter, the solar power generation system comprising:
- a plurality of control boxes (101-10N), each control box has a switch set and a processor;
- a plurality of solar panels (21-2N), each solar panel electrically connected to a DC input interface of each control box;
- a plurality of inverters (31-3N), each inverter electrically connected to a DC master output interface of each control box;
- at least one backup inverter (3R), the backup inverter (3R) parallel connected to a DC backup output interface of each control box;
- at least one AC wiring box (40), the backup inverter (3R) and the inverters (31-3N) parallel connected to the AC wiring box (40);
- a data logger (50), the data logger (50) communicatively connected to the control boxes (101-10N), the inverters (31-3N) and the backup inverter (3R);
- wherein each switch set has contact (a), contact (b), contact (g), contact (h), contact (d), contact (e), contact (i) and contact (j); when each inverter is normally operated, each processor can control each switch set to switch to a master channel, each contact (a) is electrically connected to each contact (b), each positive electrode of the solar panels (21-2N) can connect to each positive electrode of the inverters (31-3N), each contact (g) is electrically connected to each contact (h), each negative electrode of the solar panels (21-2N) can connect to each negative electrode of the inverters (31-3N), each solar panel can supply power to each inverter by each DC input interface and each DC master output interface; when the X-th inverter is faulted, the processor of the X-th control box can control the X-th switch set to switch to a backup channel, the X-th contact (d) is electrically connected to the X-th contact (e), the positive electrode of the X-th solar panel can connect to a positive electrode of the backup inverter (3R), the X-th contact (i) is electrically connected to the X-th contact (j), the negative electrode of the X-th solar panel can connect to a negative electrode of the backup inverter (3R), the X-th solar panel can supply power to the backup inverter (3R) by the DC input interface of the X-th control box and the DC backup output interface of the X-th control box, therefore reduce the interruption time of the X-th solar panel power generation.

10. The solar power generation system having a backup inverter of claim 9, wherein each contact (a) is parallel connected to each contact (d), each contact (a) and each contacts (d) can be connected to each positive electrode of the solar panels (21-2N) by each of the DC input interfaces, each contact (b) can be connected to each positive electrode of the inverters (31-3N) by each of the DC master output interfaces, each contact (e) is parallel connected to the positive electrode of the backup inverter (3R) by each of the DC backup output interfaces; each contact (g) is parallel connected to each contacts (i), each contact (g) and each contact (i) can be connected to each negative electrode of the solar panels (21-2N) by each of the DC input interfaces, each contact (h) can be connected to each negative electrode of the inverters (31-3N) by each of the DC master output interfaces, each contact (j) is parallel connected to the negative electrode of the backup inverter (3R) by each of the DC backup output interfaces; a driver is disposed between each processor and each switch set, each processor is electrically connected to each driver, and each driver is electrically connected to each switch set, therefore each switch set can be controlled.

11. A solar power generation system having a backup inverter, the solar power generation system comprising:
- a plurality of control boxes (101-10N), each control box has a switch set;
- a plurality of solar panels (21-2N), each solar panel electrically connected to a DC input interface of each control box;
- a plurality of inverters (31-3N), each inverter electrically connected to a DC master output interface of each control box;
- at least one backup inverter (3R), the backup inverter (3R) parallel connected to a DC backup output interface of each control box;
- at least one AC wiring box (40), the backup inverter (3R) and the inverters (31-3N) parallel connected to the AC wiring box (40);
- a data logger (50), a first communication port of the data logger (50) can serially connect the inverters (31-3N) and the backup inverter (3R), a second communication port of the data logger (50) can serially connect the control boxes (101-10N);
- wherein each control box has a processor, when each inverter is normally operated, each processor can control each switch set to switch to a master channel, each solar panel can supply power to each inverter by each DC input interface and each DC master output interface; when the X-th inverter is faulted, the processor of the X-th control box can control the X-th switch set to switch to a backup channel, the X-th solar panel can supply power to the backup inverter (3R) by the DC input interface of the X-th control box and the DC backup output interface of the X-th control box, therefore reduce the interruption time of the X-th solar panel power generation.

12. The solar power generation system having a backup inverter of claim 11, wherein each switch set has contact (a), contact (b), contact (c), contact (d), contact (e) and contact (f); when each switch set is switched to the master channel, each contact (a) is electrically connected to each contact (b), therefore each positive electrode of the solar panels (21-2N) can connect to each positive electrode of the inverters (31-3N); and each contact (d) is electrically connected to each contact (e), therefore each negative electrode of the solar panels (21-2N) can connect to each negative electrode of the inverters (31-3N); when the X-th switch set is switched to a backup channel, the X-th contact (a) is electrically connected to the X-th contact (c), therefore the positive electrode of the X-th solar panel can connect to a positive electrode of the backup inverter (3R); and the X-th contact (d) is electrically connected to the X-th contact (f), therefore the negative electrode of the X-th solar panel can connect to a negative electrode of the backup inverter (3R).

13. The solar power generation system having a backup inverter of claim 12, wherein each of the contacts (a) can be connected to each positive electrode of the solar panels (21-2N) by each of the DC input interfaces, each of the contacts (b) can be connected to each positive electrode of the inverters (31-3N) by each of the DC master output interfaces, each of the contacts (c) can be parallel connected to the positive electrode of the backup inverter (3R) by each of the DC backup output interfaces, each of the contacts (d) can be connected to each negative electrode of the solar panels (21-2N) by each of the DC input interfaces, each of the contacts (e) can be connected to each negative electrode of the inverters (31-3N) by each of the DC master output interfaces, each of the contacts (f) can be parallel connected to the negative electrode of the backup inverter (3R) by each of the DC backup output interfaces; a driver is disposed between each processor and each switch set, each processor is electrically connected to each driver, and each driver is electrically connected to each switch set, therefore each switch set can be controlled.

14. The solar power generation system having a backup inverter of claim 11, wherein each switch set has contact (a), contact (b), contact (g), contact (h), contact (d), contact (e), contact (i) and contact (j); when each switch set is switched to the master channel, each contact (a) is electrically connected to each contact (b), therefore each positive electrode of the solar panels (21-2N) can connect to each positive electrode of the inverters (31-3N); and each contact (g) is electrically connected to each contact (h), therefore each negative electrode of the solar panels (21-2N) can connect to each negative electrode of the inverters (31-3N); when the X-th switch set is switched to a backup channel, the X-th contact (d) is electrically connected to the X-th contact (e), therefore the positive electrode of the X-th solar panel can connect to a positive electrode of the backup inverter (3R); and the X-th contact (i) is electrically connected to the X-th contact (j), therefore the negative electrode of the X-th solar panel can connect to a negative electrode of the backup inverter (3R).

15. The solar power generation system having a backup inverter of claim 14, wherein each of the contacts (a) is parallel connected to each of the contacts (d), each of the contacts (a) and each of the contacts (d) can be connected to each positive electrode of the solar panels (21-2N) by each of the DC input interfaces, each of the contacts (b) can be connected to each positive electrode of the inverters (31-3N) by each of the DC master output interfaces, each of the contacts (e) is parallel connected to the positive electrode of the backup inverter (3R) by each of the DC backup output interfaces; each of the contacts (g) is parallel connected to each of the contacts (i), each of the contacts (g) and each of the contacts (i) can be connected to each negative electrode of the solar panels (21-2N) by each of the DC input interfaces, each of the contacts (h) can be connected to each negative electrode of the inverters (31-3N) by each of the DC master output interfaces, each of the contacts (j) is parallel connected to the negative electrode of the backup inverter (3R) by each of the DC backup output interfaces; a driver is disposed between each processor and each switch set, each processor is electrically connected to each driver, and each driver is electrically connected to each switch set, therefore each switch set can be controlled.

16. A solar power generation system having a backup inverter, the solar power generation system comprising:
a control box (80), the control box (80) has a plurality of input terminals (81), a plurality of output terminals (82) and at least one backup terminal (83);
a plurality of solar panels (21-2N), the solar panels (21-2N) individually connected to the input terminals (81) by a plurality of input cables (C1-CN);
a plurality of inverters (31-3N), the inverters (31-3N) individually connected to the output terminals (82) by a plurality of output cables (W1-WN);
at least one backup inverter (3R), the backup inverter (3R) connected to the backup terminal (83) by a backup cable (R3);
at least one AC wiring box (40), the backup inverter (3R) and the inverters (31-3N) parallel connected to the AC wiring box (40);
wherein each of the input terminals (81) is electrically connected to each of the output terminals (82); when each inverter is normally operated, each of the input cables (C1-CN) and the output cables (W1-WN) can form a master channel, each of the solar panels (21-2N) can supply power to each of the inverters (31-3N) by each of the output terminals (82); when the X-th inverter is faulted, the X-th output cable can manually change it to connect to the backup terminal (83), the X-th output cable and the backup cable (R3) can form a backup channel, the X-th solar panel can supply power to the backup inverter (3R) by the backup terminal (83).

17. The solar power generation system having a backup inverter of claim 16, wherein a DC fuse and a surge arrester can be disposed between each input terminal (81) and each output terminal (82).

18. The solar power generation system having a backup inverter of claim 16, wherein the solar power generation system further comprises a data logger (50); the inverters (31-3N) and the backup inverter (3R) can be connected in series to a first communication port of the data logger (50); the data logger (50) can collect the using status of the inverters (31-3N); when the data logger (50) determines that the X-th inverter is faulted, the data logger (50) will transmit a failure message to a system manager by a network, the failure message can select from an e-mail or a SMS; wherein contents of failure message can select from a case place, an inverter group, a name of inverter, a serial number of inverter, a serial number of cable, an event time, a classification, a status, an error code or an error message.

* * * * *